United States Patent [19]

Poleshuk

[11] 4,404,731
[45] Sep. 20, 1983

[54] METHOD OF FORMING A THIN FILM TRANSISTOR

[75] Inventor: Michael Poleshuk, Webster, N.Y.

[73] Assignee: Xerox Corporation, Stamford, Conn.

[21] Appl. No.: 307,463

[22] Filed: Oct. 1, 1981

[51] Int. Cl.$^3$ ........................................... H01L 21/363
[52] U.S. Cl. ........................................ 29/571; 29/578; 29/591
[58] Field of Search ............... 29/571, 578, 591; 430/314, 319

[56] References Cited

U.S. PATENT DOCUMENTS

| | | | |
|---|---|---|---|
| 3,442,647 | 5/1969 | Klasens | 430/319 X |
| 3,481,031 | 12/1969 | Klasens | 29/571 |
| 3,669,661 | 6/1972 | Page et al. | 96/36.2 |
| 3,872,359 | 3/1975 | Feuersanger | 357/4 |
| 3,914,127 | 10/1975 | Buss et al. | 96/36 |
| 4,040,073 | 2/1977 | Luo | 148/186 X |
| 4,132,586 | 1/1979 | Schaible | 156/643 |
| 4,145,459 | 3/1979 | Goel | 427/88 |
| 4,332,075 | 6/1982 | Ota et al. | 29/571 |
| 4,343,081 | 8/1982 | Morin et al. | 148/187 X |

OTHER PUBLICATIONS

"Effect of Ion Implantation on CdSe Thin Film Transistors", Shepherd et al. J. Vac. Sci. Technol., vol. 18, No. 3,–Apr. 1981–pp. 899–902.
"Effect of Thermal Annealing on Thin Film Transistors Processed by Photoengraving", Shepherd et al., J. Vac. Sci. Technol., vol. 17, No. 1,–Jan./Feb. 1980, pp. 485–488.

Primary Examiner—G. Ozaki
Attorney, Agent, or Firm—Robert A. Chittum; John B. Mason

[57] ABSTRACT

In the formation of a thin film device, integrity of the semiconductor-insulator and semiconductor-conductor interfaces is preserved by depositing layers of insulator, semiconductor, and conductor in successive sequence under continuous vacuum. In a preferred embodiment, the method minimizes contamination exposure of the critical interfaces between semiconductor and gate insulator and semiconductor and source-drain contacts of a thin film transistor.

14 Claims, 14 Drawing Figures

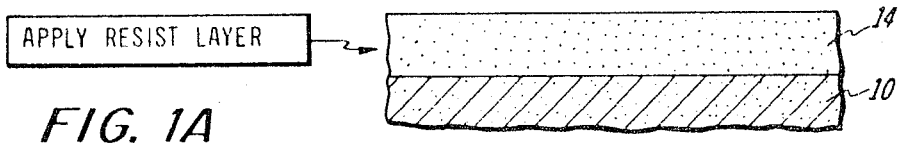
FIG. 1A APPLY RESIST LAYER
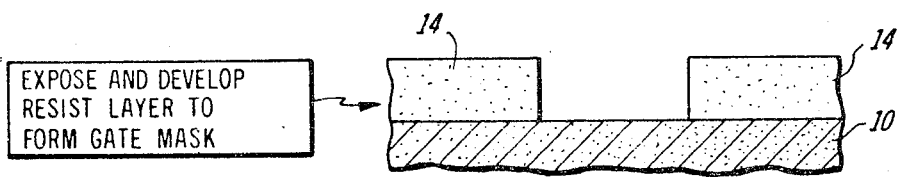
FIG. 1B EXPOSE AND DEVELOP RESIST LAYER TO FORM GATE MASK
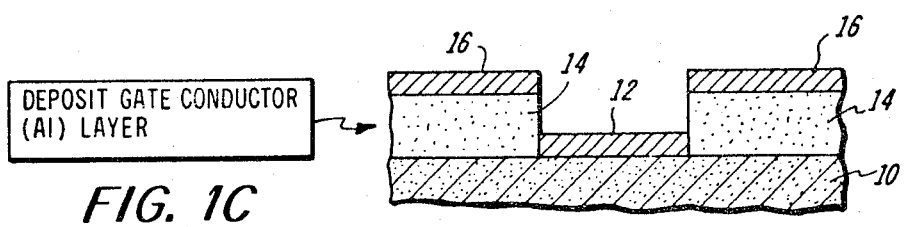
FIG. 1C DEPOSIT GATE CONDUCTOR (Al) LAYER
FIG. 1D REMOVE RESIST TO DELINEATE GATE
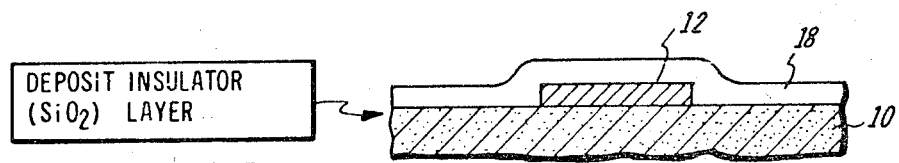
FIG. 1E DEPOSIT INSULATOR (SiO$_2$) LAYER
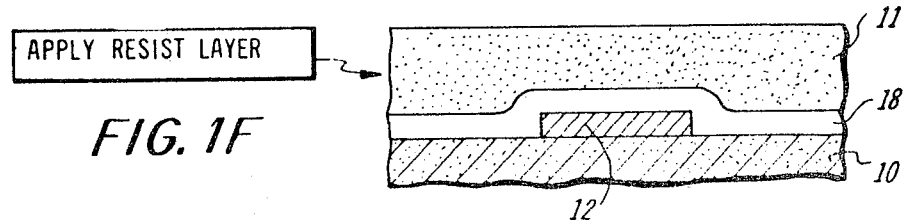
FIG. 1F APPLY RESIST LAYER

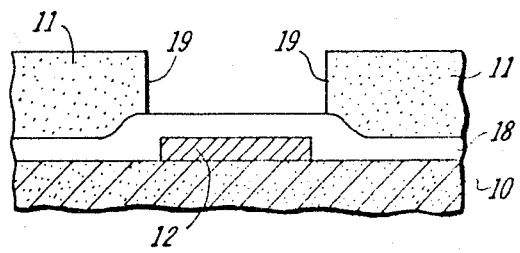
FIG. 1G — EXPOSE AND DEVELOP RESIST TO FORM ADDITIVE MASK
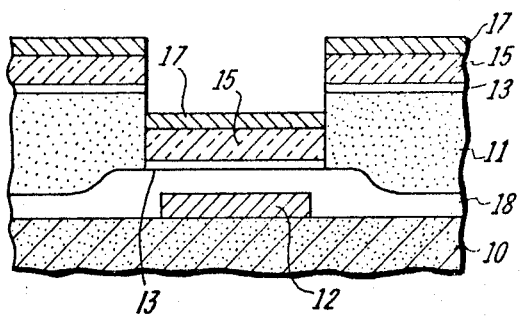
FIG. 1H — IN SINGLE PUMPDOWN DEPOSIT INSULATOR (SiO$_2$)-13 SEMICONDUCTOR (CdSe), ~15 AND SOURCE/DRAIN (Cr) ~17 CONTACT LAYERS
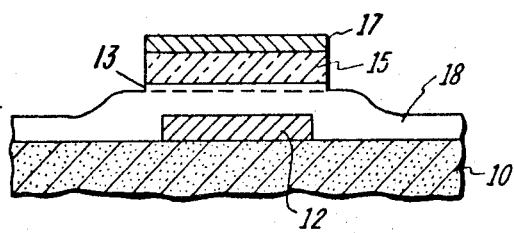
FIG. 1I — REMOVE RESIST, LIFTING OFF OVERLYING LAYERS
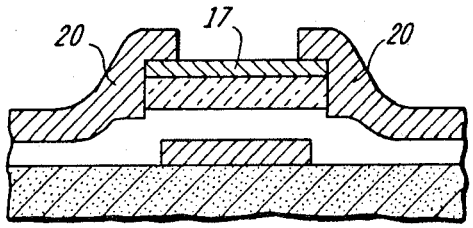
FIG. 1J — PREPARE SOURCE/DRAIN ELECTRODES BY ADDITIVE PROCESS
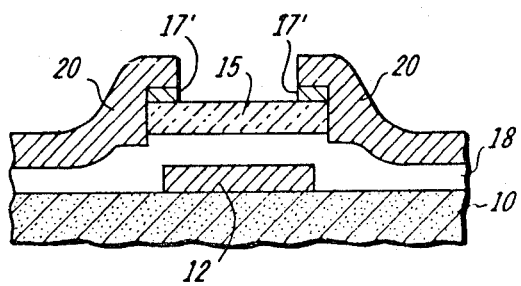
FIG. 1K — DRY ETCH Cr FROM CdSe CHANNEL USING SOURCE/DRAIN ELECTRODES AS MASK

METHOD OF FORMING A THIN FILM TRANSISTOR

BACKGROUND OF THE INVENTION

This invention broadly relates to a process for forming a device by selective deposition and patterning of thin film layers of insulative, semiconductive, and conductive materials. More particularly, the invention concerns an improved method of forming such a device wherein thin film layers of insulator, semiconductor, and metal are deposited in successive sequence under continuous vacuum. The invention has particular utility in the photolithographic fabrication of thin film transistors and arrays thereof. In the fabrication of such devices, single pump down formation of the semiconductor-gate insulator and semiconductor-source/drain contact interfaces minimizes the exposure of these critical interfaces to contamination during wet processing.

With increasing demand for high device density, photolithographic processes have become increasingly popular as economical means for fabricating thin film transistors. Such techniques are particularly advantageous in the preparation of high density thin film transistor drivers for high resolution, large area displays, such as those incorporating liquid crystal or electroluminescent media.

Conventional photolithographic techniques characteristically employ wet chemistry processes to selectively define patterned layers of conductive and insulative materials. These wet processes include chemical polish etching for initial substrate preparation, structural, or pattern delineation, etching to create a relief structure geometry, and photoresist processing.

The electrical performance and the stability of surface field effect transistors are critically dependent upon the quality of the semiconductor-insulator interface and upon the ohmic properties of source drain contacts to semiconductor interface. The quality of both interfaces can be impaired by impurity contamination arising from exposure from each material (i.e., conductor, insulator, and semiconductor) surface to wet processing. Such contamination increases the densities of interface states and reduces conduction modulation. Incorporation of ionic species present in the chemical solution alters the otherwise predictable threshold voltages. Charge transfer processes at interface states and field aided migration of mobile ionic species induces operational instabilities into the devices. Impurity related contact barriers degrade transconductance by limiting current and crowding transistor characteristics. These wet processing induced degradations create device characteristics problems such as non-reproducability from batch to batch and non-uniformity among devices within a single batch. These problems are particularly pernicious when a large area transistor array is being fabricated for use in a display. In this context, the demands of high quality image resolution necessitates a high degree of uniformity among transistor characteristics and an extremely high yield of operable devices.

The present invention provides a process for overcoming the disadvantages which can arise from exposure of critical surfaces of the constituent layers of the thin film device to wet processing.

SUMMARY OF THE INVENTION

The present invention provides methods for preserving the integrity of the interfaces between layers of semiconductor and insulator and semiconductor and conductor during formation of a thin film device. This is achieved by depositing the layers of insulator, semiconductor, and conductor in the desired sequence under continuous vacuum, i.e., in a single vacuum pump down operation. This technique effectively seals, or encapsulates, the damage (i.e., contamination or impurity) sensitive semiconductor so that subsequent wet processing steps do not adversely affect the electrical characteristics of the device by contaminating critical interfaces. As well, sequential deposition of these layers under vacuum affords protection of the semiconductor interfaces against degradation by air borne contaminants.

In accordance with one particularly advantageous embodiment, the invention minimizes contamination exposure of the critical interfaces between the semiconductor and gate and semiconductor and source and drain contacts of a thin film transistor. Exemplary of this method is a fabrication sequence utilizing aluminum, silicon dioxide, cadmium selenide, and chromium and aluminum, for the gate electrode, gate insulator, semiconductor, and source and drain contacts, respectively. The initial step in this sequence is the formation of the aluminum gate electrode on a portion of a surface of a substrate by, for example, additive photolithographic delineation. As typical and well known in the prior art, for example, U.S. Pat. No. 4,040,073 to Luo or U.S. Pat. No. 4,132,586 to Schaible et al, the gate electrode extends to the edge of the substrate for a single transistor or to an integrally and concurrently formed bus bar that extends to the edge of the substrate for an array of transistors. Contact tabs may be formed or attached to the gate electrode or bus bar at the substrate edge. An additive photoresist mask is then formed for definition of the semiconductor pad. The silicon dioxide gate insulator, cadmium selenide, and chromium contact layers are then sequentially deposited through the apertures in the additive mask during a single vacuum pump down to form the critical semiconductor-insulator interface and semiconductor-source and drain contacts. During subsequent lift off removal of the photoresist mask, the chromium contact layer functions as a protective cap over the semiconductor pad, preventing harmful interaction between the semiconductor and the stripping solution, i.e., the solvent per se or ionic species contained therein. Two steps remain for completion of the thin film transistor, removal of that portion of the chromium layer overlying the conducting channel of the semiconductor and definition of the aluminum source and drain network. The aluminum source and drain electrodes are formed by additive processing to provide a structure wherein respective source and drain electrodes are separated by a gap corresponding to the width of the conducting channel of the semiconductor layer and exposing portions of the chromium layer. In the final process step, the aluminum source drain network structure functions as a substractive mask through which chromium is selectively removed from the thin film transistor conducting channel by dry etching techniques.

The dry etching techniques, e.g., plasma etching, are preferred for this final step because of the high degree of etch selectivity and "cleaniness" which are characteristic of such processes.

Alternatively, the sequence for fabricating a thin film transistor includes the step of depositing an initial layer of insulative material to cover the gate electrode and the entire surface of the substrate on which the gate electrode is formed. Utilization of this process to provide a "full" rather than patterned insulator layer over the substrate and gate electrode is particularly advantageous as a means for enhancing the insulation between source and gate electrode gate crossovers in a multi-transistor array.

In a preferred variation of the foregoing processes, the side wall surfaces of the openings in the photoresist mask used to find the semiconductor pad are coated with a thin film of insulator, e.g. silicon dioxide, prior to the single pump down sequential deposition of the critical device layers. This step insures minimum contamination of the electrically active regions of the device by complete isolation thereof from organic materials present during removal of the photoresist mask.

BRIEF DESCRIPTION OF THE DRAWINGS

FIGS. 1A-1K are diagramatic cross-sectional views of a structure being fabricated in accordance with a preferred embodiment of the invention, as well as a flow chart describing steps within the process.

DESCRIPTION OF THE PREFERRED EMBODIMENTS

Figure 2A:
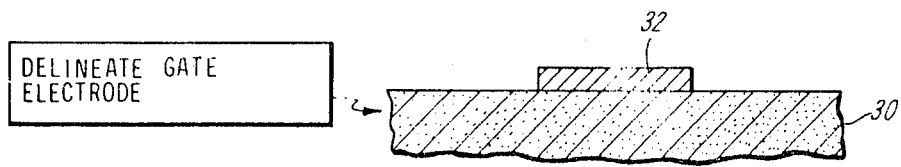
FIGS. 2A-2C are diagramatic cross-sectional views of a device at selected stages of an alternative fabrication sequence.

FIGS. 1A-1D illustrate the formation of a gate electrode 12 upon a surface of substrate 10. A broad range of materials may be employed for substrate 10, subject to the general limitation that the material chosen be insulative relative to the material selected for gate electrode 12. The exact choice of a material for substrate 10 will, of course, depend upon the particular application in which the thin film transistor is utilized. When employed as a driver of an element in a liquid crystal display, for example, substrate 10 would comprise one of the planar glass plates which are typically employed to contain the liquid crystal media. In other applications, utility may dictate that substrate 10 be composed of other insulative material, such as ceramics, semiconductors, plastic materials, and the like. Quite satisfactory results have been obtained with the use of a barium aluminum borosilicate composition sold commercially by Corning Glass Works of Corning, N.Y. under the trademark Corning 7059 Glass.

The additive, or lift off, technique illustrated in FIGS. 1A-1D is well known. As shown, this method begins with the application of a covering layer of resist material 14 on the upper surface of substrate 10. Resist 14 can comprise conventional photo or electron beam materials which are characterized by radiation-induced alteration in solubility that enables subsequent removal with aqueous solutions. A suitable material is Shipley's AZ 1350B or AZ 1350J sold by Shipley Company, Inc., of Newton, MA. Resist 14 is applied in any conventional manner, as for example, by spin coating. Thereafter, in accordance with well known photolithographic techniques, resist layer 14 is processed into an additive mask by conventional steps of exposure, development, and removal of selective pattern areas thereof.

In the next step, as illustrated in FIG. 1C, a 1,000 Angstrom layer of aluminum is deposited, as by vacuum evaporation, sputtering, or the like, over the surface of the mask substrate. This aluminum layer is deposited through the apertures in the photoresist mask onto the surface of the substrate 10 to form gate electrode 12 and on top of the remaining portions of resist layer 14 as indicated at 16.

Next, to arrive at the gate structure shown in FIG. 1D, the remaining portions of resist 14 and the overlying aluminum layer 16 are removed using conventional lift off removal techniques, i.e., by exposing the structure to a solvent suited to the solubility of the resist 14.

It will be appreciated that the gate structure shown in FIG. 1D could be produced by subtractive processing, rather than through the additive steps illustrated in FIGS. 1A-1D.

After formation of the gate, as shown in FIG. 1E, a blanket layer of aluminum oxide 18 or silicon dioxide is deposited over the gate electrode 12 and the exposed surface of substrate 10. This insulative layer can be applied in any conventional manner, as for example, by evaporation or sputtering within a suitable vacuum device. As noted above, coverage of the complete active surface of the substrate is desirable for multi transistor arrays. From a practical standpoint, complete coverage of the entire surface of the substrate is not preferred, since the contact fingers for the array bus lines are typically located around the periphery of the substrate. However, as will be discussed hereinafter with reference to FIGS. 2A-2C, it is not essential that the complete substrate be covered with an insulator. Where such a layer is employed, a thickness range of about 2,0000 Å to about 4,000 Å is preferred.

A second blanket layer of resist 11 is applied over insulator 18 as illustrated in FIG. 1F. As with resist 14, various solvent soluble materials may be chosen for the resist layer 11, the same being applied by any of the well known techniques such as spinning, spraying, dipping or the like. Again utilizing standard lithographic techniques, resist layer 11 is exposed and developed in a pattern corresponding to the desired dimensions of the semiconductor pad for the thin film transistor as illustrated by the structure of FIG. 1G.

The patterned resist layer 11 is used as an additive mask for depositing, in successive sequence, layers of insulator ($SiO_2$) 13, semiconductor (CdSe) 15, and conductor (Cr) 17. It is of critical importance to the invention that these layers be deposited under the continuous vacuum of a single pump down operation. This is accomplished by placing the structure of FIG. 1G into any suitable vacuum chamber and reducing the pressure to about $5 \times 10^{-7}$ torr. Thereafter, utilizing conventional deposition techniques of the integrated circuit fabrication art, the layers of $SiO_2$, CdSe, and Cr are deposited in succession. The ambient for deposition of $SiO_2$ could consist of $5 \times 10^{-5}$ partial pressure of oxygen. Referring to FIG. 1H, it will be appreciated that the initial deposition of a thin additional layer of insulator 13 onto the pre-existing insulator layer 18 provides a clean insulative interface for the subsequently deposited semiconductor layer 15, isolating the same from any contaminants or impurities introduced onto the surface of insulator 18 during the process of forming the additive mask thereon or during handling of the substrate or exposure thereof to air. A thickness of about 800 Å for insulator layer 13 has been found to be adequate for these purposes. Following deposition of the layer of $SiO_2$, a layer of CdSe is deposited to a thickness of about 300 Å followed by deposition of a layer of Cr to a thickness of about 500 Å.

Utilizing conventional lift off removal techniques, the layer of resist 11 and all of the layers overlying it are removed by exposing the coated substrate of FIG. 1H to a suitable solvent for resist 11. Such solvents include acetone and other commercially available strippers.

In a preferred alternative embodiment of the invention, maximum immunity against contamination of the electronically active device regions is achieved by lining the side walls 19 of the apertures in resist layer 11 with a thin film of insulator ($SiO_2$) prior to deposition of layers 15 and 17. This additional step (which is not shown) completely isolates the critical regions of the device from the organic materials utilized in the subsequent processing. Such a protective layer of silicon dioxide can be deposited as a separate step or concurrently with the deposition of layer 13.

After removal of the lift off mask, the structure is as shown in FIG. 11. During lift off removal of the resist and overlying layers, the chromium film acts as a protective cap to isolate the upper surface of semiconductor pad 15 from processing contaminants in the solvent. Referring briefly to FIG. 1K, the completed thin film transistor structure is shown having source and drain electrodes 20 electrically connected to the semiconductor through chromium contacts 17'. To arrive at the structure, source and drain electrodes 20 are formed by conventional additive processing to yield the structure of FIG. 1J. In the context of the illustrative example, the source and drain electrodes 20 are aluminum and are patterned so as to expose the chromium contact layer 17.

In the final step, the source and drain electrode network is employed as a subtractive mask during selective dry etching of chromium from the conducting channel of the thin film transistor. Dry etching techniques are preferred for this step because of the characteristic cleanliness of such methods as well as the high degree of directionality offered thereby. Plasma etching utilizing a reaction gas, e.g. $CCl_4$ vapor in the air or oxygen has been found to be particularly effective in removing chromium in the embodiment illustrated herein. The conductive material chosen for the source and drain contacts 20 must be resistant to the plasma employed to etch the conductive contact layer 17. While other materials may be used, aluminum deposited to a desired thickness of about 1,000 Angstroms has been demonstrated to be sufficiently resistant to plasma etching in a reaction gas, such as mentioned above. It will be appreciated that selection of other materials for the source and drain electrodes 20 and the contacts 17' and the choice of a suitable ambient for the selected materials other than that described herein are possible.

Figure 2B:
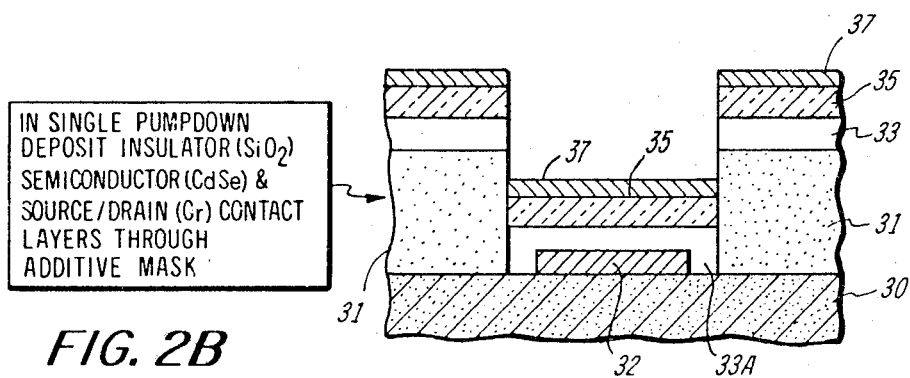
Figure 2C:
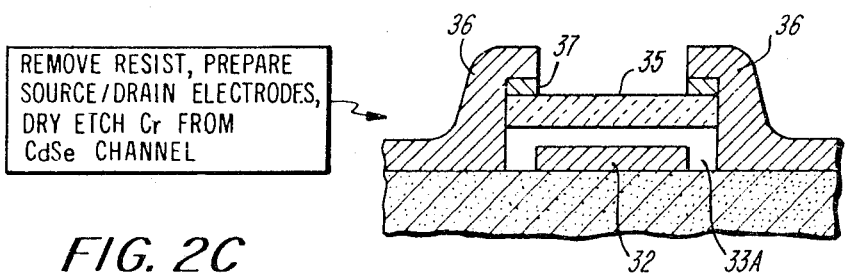

An alternative sequence for fabricating a thin film transistor is illustrated in FIGS. 2A-2C. FIG. 2A illustrates a gate electrode 32 formed upon a substrate 30. This structure corresponds to the structure illustrated in FIG. 1D and is produced by any suitable deposition techniques, such as the additive process discussed in conjunction with FIGS. 1A-1D.

After delineation of the gate electrode 32, an additive mask is formed by exposure and development of a resist layer 31 which is applied to the structure of FIG. 2A. Unlike the process discussed with reference to FIGS. 1A-1K, there is no initial deposition of an insulator layer such as layer 18 of FIG. 1E. Instead, the resist is coated directly over the exposed surfaces of substrate 30 and gate electrode 32. Thereafter, using standard lithographic techniques, portions of the resist layer are selectively removed to expose the gate electrode 32 and portions of the surface of substrate 30 adjacent the gate electrode to form an additive mask. In the next step, layers of insulator 33, 33A ($SiO_2$) semiconductor 35 (CdSe), and conductor 37 (Cr) are deposited onto the mask structure during a single vacuum pump down operation by means such as discussed in conjunction with FIG. 1H. The resulting structure is illustrated in FIG. 2B, wherein it will be noted that, by virtue of the selected pattern in the resist mask, that portion of the deposited insulator designated 33A forms a gate insulator layer which covers both upper and side surfaces of gate electrode 32.

With process steps identical to those described with respect to FIGS. 1I through 1K, the lift off mask is removed, source and drain electrodes 36 are delineated, and the chromium contact layer plasma etched using the source drain network as a dry etch. These steps produce the thin film transistor shown in FIG. 2C.

An array of transistors of the type shown in FIG. 2c is completed by depositing crossover insulators (not shown) for dielectric isolation of source/drain bus lines from gate line 32 by methods well known in the art.

I claim:
1. An improved method of forming a thin film transistor on a substrate of the type having a gate electrode of a conductive material formed on a portion of a surface of the substrate and extending to the edge of the substrate to provide means for contact therewith, wherein the improved method comprises the steps of:
   (a) forming a first insulator layer covering the gate electrode and the remaining portion of the surface of the substrate on which said electrode is formed, the end of the gate electrode at the substrate edge not being covered to permit contact therewith;
   (b) forming on said first insulator layer, a masking layer having a predetermined opening therein exposing a portion of said first insulator layer;
   (c) sequentially depositing, under vacuum, a second insulator layer, a semiconductor layer, and a conductive contact layer on said masking layer and on the exposed portion of said first insulator layer;
   (d) removing said masking layer and the portions of the second insulator layer, the semiconductor layer, and the conductive contact layer deposited thereon;
   (e) selectively forming a third conductor layer to define source and drain contacts to said semiconductor layer, said third conductor layer having a predetermined opening therein exposing a portion of said conductive contact layer; and
   (f) removing the exposed portion of said conductive contact layer to expose said semiconductor layer.

2. The method of claim 1, wherein said step (f) comprises removing the exposed portions of said conductive contact layer by dry etching.

3. The method of claim 2 wherein said dry etching comprises plasma etching.

4. The method of claim 2 wherein said dry etching comprises ion beam milling.

5. A method of forming an active region of a thin film transistor on a substrate having a gate electrode deposited thereon which extends to the edge of the substrate to provide means for contact therewith, the method comprising depositing thin film layers of an insulator, a semiconductor, and a conductive metal upon a portion of the gate electrode and a surface portion of the substrate adjacent the gate electrode portion in successive sequence under continuous vacuum, said surface portion of the substrate and gate electrode portion being exposed by a predetermined opening in a mask to define and delineate the exact transistor dimensions by said opening.

6. The method of claim 5, wherein said mask comprises a photoresist mask formed by removing a portion of a photoresist masking layer deposited upon said substrate to expose the surface portion of said substrate, gate electrode portion, and side wall surfaces of the opening in said photoresist mask.

7. The method of claim 6, further including:
(a) removing said photoresist mask and the portions of the insulator, semiconductor, and conductive metal deposited thereon;
(b) selectively forming a second conductor layer to define separate source and drain contacts to said semiconductor, said source and drain contacts having a space therebetween to expose a portion of the conductive metal; and
(c) removing the exposed portion of the conductive metal to expose the semiconductor so that separate remaining portions of the conductive metal lie between the semiconductor and portions of the source and drain contacts.

8. The method of claim 6, further including the step of depositing a thin film of insulating material on the side wall surfaces of the opening in said photoresist mask prior to the step of depositing said layers of insulator, semiconductor, and metal.

9. The method of claim 6, wherein a thin film of insulating material is deposited on the side wall surfaces of the opening in said photoresist mask concurrently with the deposition of said layer of insulator.

10. A method of forming a thin film transistor on a substrate having a gate electrode of a conductive metal on a portion of a surface of the substrate, the gate electrode having an extension leading to one edge of the substrate to provide means for contact therewith after a transistor is formed thereover, the method comprising the steps of:
(a) forming a masking layer covering the surface of said substrate having the gate electrode, said masking layer having a predetermined opening therein exposing said gate electrode and a portion of the surface of said substrate adjacent said electrode;
(b) sequentially depositing, under vacuum, an insulator layer, a semiconductor layer, and a conductive contact layer on said masking layer and on the gate electrode and exposed portion of the surface of said substrate;
(c) removing said masking layer and the portions of the insulator layer, semiconductor layer, and the conductive contact layer deposited thereon;
(d) selectively forming a third conductor layer to define source and drain contacts to said semiconductor layer, said third conductor layer having a predetermined opening therein exposing a portion of said conductive contact layer; and
(e) removing the exposed portion of said conductive contact layer to expose said semiconductor layer.

11. The method of claim 10, wherein said step (e) comprises removing the exposed portions of said conductive contact layer by dry etching.

12. The method of claim 11 wherein said dry etching comprises plasma etching.

13. The method of claim 11 wherein said dry etching comprises ion beam milling.

14. A method of forming an array of thin film transistors on a substrate having a predetermined pattern of gate electrodes of conductive material formed on a surface of the substrate, the gate electrodes having extensions which connect to at least one bus bar of conductive material formed on the substrate surface which extends to the edge of the substrate whereat means for contact is provided for the bus bar, the method comprising the steps of:
(a) forming a first insulator layer covering the gate electrodes, gate electrode extensions, bus bar and selected remaining portions of the surface of the substrate on which said electrodes, extensions and bus bar are formed;
(b) forming on said first insulator layer a masking layer having predetermined pattern of openings therein exposing portions of said first insulator layer;
(c) sequentially depositing, under vacuum, a second insulator layer, a semiconductor layer, and a conductive contact layer on said masking layer and on the exposed portions of said first insulator layer;
(d) removing said masking layer and the portions of the second insulator layer, the semiconductor layer, and the conductive contact layer deposited thereon;
(e) selectively forming a third conductor layer to define source and drain contacts to said semiconductor layer, said third conductor layer having a predetermined pattern of openings therein exposing portions of said conductive contact layer; and
(f) removing the exposed portions of said conductive contact layer to expose said semiconductor layer by dry etching.

* * * * *